United States Patent
Cho et al.

(10) Patent No.: US 9,496,152 B2
(45) Date of Patent: Nov. 15, 2016

(54) CARRIER SYSTEM WITH MULTI-TIER CONDUCTIVE POSTS AND METHOD OF MANUFACTURE THEREOF

(75) Inventors: NamJu Cho, Uiwang-si (KR); HeeJo Chi, Ichon-si (KR); HanGil Shin, Seongnam-si (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 1062 days.

(21) Appl. No.: 12/722,852

(22) Filed: Mar. 12, 2010

(65) Prior Publication Data

US 2011/0220395 A1    Sep. 15, 2011

(51) Int. Cl.
| | |
|---|---|
| H01L 21/48 | (2006.01) |
| H01L 23/498 | (2006.01) |
| H01L 21/56 | (2006.01) |
| H01L 23/00 | (2006.01) |

(52) U.S. Cl.
CPC ......... *H01L 21/4853* (2013.01); *H01L 21/561* (2013.01); *H01L 21/568* (2013.01); *H01L 23/49811* (2013.01); *H01L 24/97* (2013.01); *H01L 2224/16225* (2013.01); *H01L 2224/16227* (2013.01); *H01L 2224/97* (2013.01); *H01L 2924/014* (2013.01); *H01L 2924/01029* (2013.01); *H01L 2924/14* (2013.01); *H01L 2924/15311* (2013.01); *H01L 2924/15787* (2013.01); *H01L 2924/181* (2013.01); *Y10T 29/49117* (2015.01)

(58) Field of Classification Search
USPC ......... 174/250, 255, 260–262; 361/748, 760, 361/765, 767, 772, 808, 809; 257/778.9
See application file for complete search history.

(56) References Cited

U.S. PATENT DOCUMENTS

| | | | |
|---|---|---|---|
| 5,371,654 A | 12/1994 | Beaman et al. | |
| 5,579,207 A | 11/1996 | Hayden et al. | |
| 6,329,609 B1 * | 12/2001 | Kaja et al. | 174/262 |
| 6,683,368 B1 | 1/2004 | Mostafazadeh | |
| 7,034,386 B2 | 4/2006 | Kurita | |
| 7,084,500 B2 * | 8/2006 | Swnson et al. | 257/738 |
| 2007/0246813 A1 | 10/2007 | Ong et al. | |
| 2008/0006942 A1 | 1/2008 | Park et al. | |
| 2008/0264684 A1 * | 10/2008 | Kang et al. | 174/262 |
| 2010/0025833 A1 | 2/2010 | Pagaila et al. | |

OTHER PUBLICATIONS

U.S. Appl. No. 12/325,193, filed Nov. 29, 2008, Ha et al.
U.S. Appl. No. 12/488,089, filed Jun. 19, 2009, Pagaila et al.
U.S. Appl. No. 12/412,886, filed Mar. 27, 2009, Ha et al.
U.S. Appl. No. 12/722,759, filed Mar. 12, 2010, Cho et al.

* cited by examiner

*Primary Examiner* — Dion R Ferguson
(74) *Attorney, Agent, or Firm* — Wong & Rees LLP (57) ABSTRACT

A method of manufacture of a carrier system includes: providing a carrier base; forming a recess in the carrier base with the recess around a planar surface; forming a first barrier on the planar surface; forming a second barrier on the carrier base in the recess; forming a first post on the first barrier; and forming a second post on the second barrier.

20 Claims, 6 Drawing Sheets

CARRIER SYSTEM WITH MULTI-TIER CONDUCTIVE POSTS AND METHOD OF MANUFACTURE THEREOF

CROSS-REFERENCE TO RELATED APPLICATION(S)

The present application contains subject matter related to concurrently filed U.S. patent application Ser. No. 12/722,359, now U.S. Pat. No. 7,928,552. The related application is assigned to STATS ChipPAC Ltd. and the subject matter thereof is incorporated herein by reference thereto.

TECHNICAL FIELD

The present invention relates generally to a carrier system, and more particularly to a system for a carrier system with multi-tier conductive posts.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package-on-package (POP). POP designs face reliability challenges and higher cost.

Thus, a need still remains for an integrated circuit packaging system improved yield, low profile, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of a carrier system including: providing a carrier base; forming a recess in the carrier base with the recess around a planar surface; forming a first barrier on the planar surface; forming a second barrier on the carrier base in the recess; forming a first post on the first barrier; and forming a second post on the second barrier.

The present invention provides a carrier system, including: a carrier base having a recess around a planar surface; a first barrier on the planar surface; a second barrier on the carrier base in the recess; a first post on the first barrier; and a second post on the second barrier.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the carrier, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact between elements. The term "processing" as used herein includes deposition of material, patterning, exposure, development, etching, cleaning, molding, and/or removal of the material or as required in forming a described structure.

Figure 1:
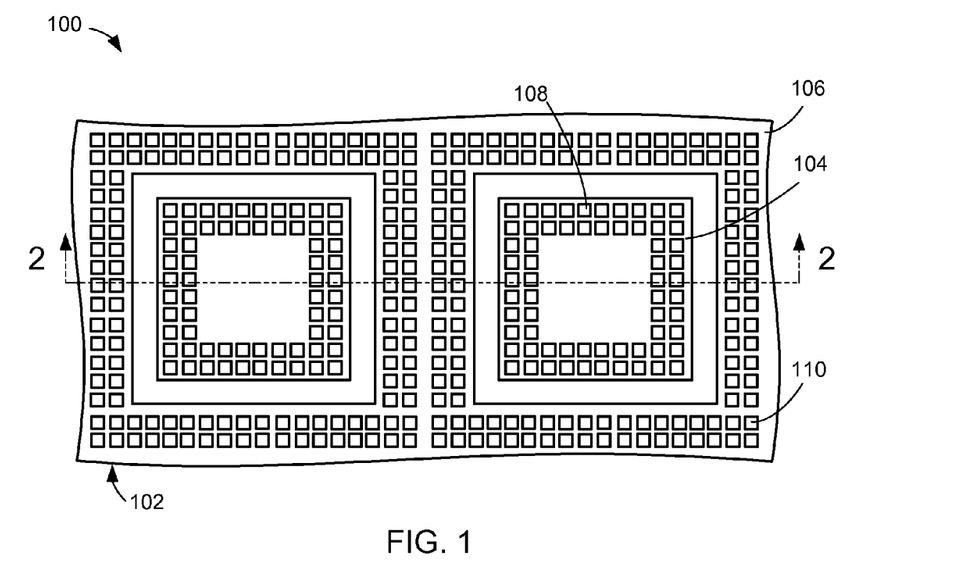
FIG. 1 is a top view of a portion of a carrier system in a first embodiment of the present invention.

Referring now to FIG. 1, therein is shown a top view of a portion of a carrier system 100 in a first embodiment of the present invention. The top view depicts a portion of a carrier base 102, such as a structure made of copper, other metals, alloys or conductive materials. The carrier base 102 is a shaped block formed from a homogenous material. The carrier base 102 can have a planar surface 104 and a recess 106. The recess 106 can be around the perimeter of the planar surface 104 where the recess 106, in this example is in a configuration of a square ring.

For illustrative purposes, the carrier system 100 is shown having the planar surface 104 in a square geometric shape, although it is understood that the planar surface 104 can have a different shape. For example, the planar surface 104 can have a rectangular geometric shape.

First posts 108, or more specifically a conductive structure or pillar made from copper or a conductive alloy, can be connected to the carrier base 102. The first posts 108 can be over the carrier base 102 along the planar surface 104. The first posts 108 can be along the peripheral portion of the planar surface 104.

For illustrative purposes, the carrier system 100 is shown having the first posts 108 in a dual row configuration, although it is understood that the first posts 108 can have a different configuration. For example, the carrier system 100 can have the first posts 108 in a single row or triple row configuration. As a further example, the carrier system 100 can have the first posts 108 in a staggered configuration.

Second posts 110, or more specifically a conductive interconnect or pillar made from copper or a conductive alloy, can be connected to the carrier base 102. The second posts 110 can be over the carrier base 102 in the recess 106.

For illustrative purposes, the carrier system 100 is shown having the second posts 110 in a dual row configuration, although it is understood that the second posts 110 can have a different configuration. For example, the carrier system 100 can have the second posts 110 in a single row or triple row configuration. As a further example, the carrier system 100 can have the second posts 110 in a staggered configuration.

For further illustrative purposes, the carrier system 100 is shown with the first posts 108 and the second posts 110 having a square cross-sectional geometric shape, although it is understood that the first posts 108 and the second posts 110 can have a different cross-sectional geometric shape. For example the carrier system 100 can have the first posts 108 and the second posts 110 having a circular or rectangular cross-sectional geometric shape.

Figure 2:
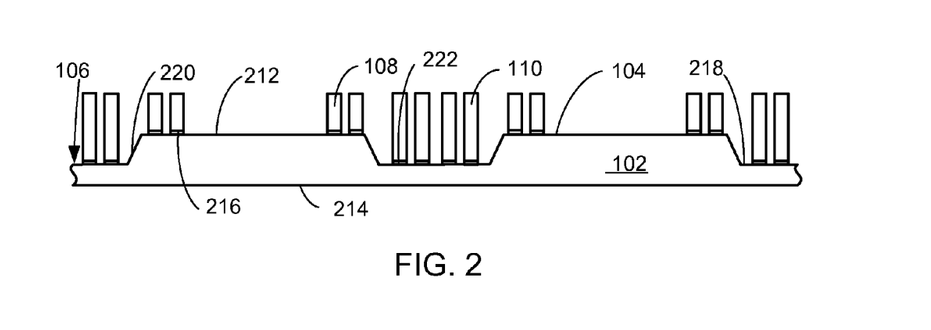
FIG. 2 is a cross-sectional view of the carrier system along line 2-2 of FIG. 1.

Referring now to FIG. 2, therein is shown a cross-sectional view of the carrier system 100 along line 2-2 of FIG. 1. The carrier base 102 can have a carrier first side 212 and a carrier second side 214. The planar surface 104 and the recess 106 can be along the carrier first side 212.

The recess 106 can have a recess bottom 218 and a recess slope 220. As an example, the recess slope 220 can form an obtuse angle or a right angle with the recess bottom 218. The recess bottom 218 can be parallel with the planar surface 104.

A first barrier 216 can be on and protrude from the carrier first side 212 along the planar surface 104. As an example, the first barrier 216 can function as an etching protection layer, an adhesion layer, a buffer diffusion barrier layer, a wet-enhancing layer, or a combination thereof.

A second barrier 222 can be on the carrier first side 212 at the recess bottom 218. As an example, the second barrier 222 can function as an etching protection layer, an adhesion layer, a buffer diffusion barrier layer, a wet-enhancing layer, or a combination thereof.

The first posts 108 can be attached to the carrier first side 212 along the planar surface 104 with the first barrier 216. The first posts 108 can be perpendicular to the carrier first side 212. The portion of the first posts 108 facing away from the planar surface 104 can be parallel with the planar surface 104.

The second posts 110 can be attached to the carrier first side 212 along the recess bottom 218 with the second barrier 222. The second posts 110 can be perpendicular to the carrier first side 212. The portion of the second posts 110 facing away from the recess bottom 218 can be parallel with the recess bottom 218. The portion of the second posts 110 facing away from the carrier first side 212 can be co-planar with the portion of the first posts 108 facing away from the carrier first side 212.

It has been discovered that the present invention provides a carrier system 100 having improved reliability. The first barrier 216 and the second barrier 222 improve connectivity with the carrier base 102 by providing adhesion or a wet-enhancing layer between the carrier base 102 and both the first posts 108 and the second post 110.

Figure 3:
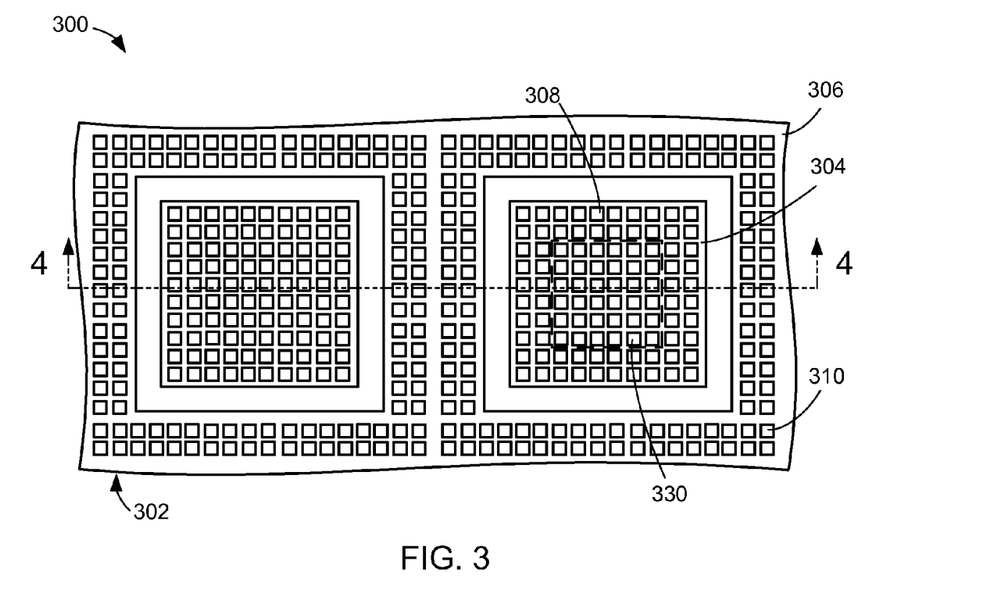
FIG. 3 is a top view of a portion of a carrier system in a second embodiment of the present invention.

Referring now to FIG. 3, therein is shown a top view of a portion of a carrier system 300 in a second embodiment of the present invention. The top view depicts a portion of a carrier base 302, such as a structure made of copper, other metals, alloys or conductive materials. The carrier base 302 can have a planar surface 304 and a recess 306. The recess 306 can be around the perimeter of the planar surface 304 where the recess 306, in this example is in a configuration of a square ring.

For illustrative purposes, the carrier system 300 is shown having the planar surface 304 in a square geometric shape, although it is understood that the planar surface 304 can have a different shape. For example, the planar surface 304 can have a rectangular geometric shape.

First posts 308, or more specifically a conductive structure or pillar made from copper or a conductive alloy, can be connected to the carrier base 302. The first posts 308 can be over the carrier base 302 along the planar surface 304. The first posts 308 can be along the peripheral portion of the planar surface 304.

For illustrative purposes, the carrier system 300 is shown having the first posts 308 in a dual row configuration, although it is understood that the first posts 308 can have a different configuration. For example, the carrier system 300 can have the first posts 308 in a single row or triple row configuration. As a further example, the carrier system 300 can have the first posts 308 in a staggered configuration.

Contact pads 330, such as conductive pads made from materials including copper, copper alloys or conductive alloys, can be along the planar surface 304 of the carrier base 302. The contact pads 330 can be along an inner portion of the planar surface 304, as depicted by the dashed square. The first posts 308 can be adjacent to and surround the contact pads 330 along the planar surface 304.

For illustrative purposes, the carrier system 300 is shown having the contact pads 330 in an array configuration, although it is understood that the contact pads 330 can have a different configuration. For example, the carrier system 300 can have the contact pads 330 in a staggered configuration.

Second posts 310, or more specifically a conductive interconnect or pillar made from copper or a conductive alloy, can be connected to the carrier base 302. The second posts 310 can be over the carrier base 302 in the recess 306.

For illustrative purposes, the carrier system 300 is shown having the second posts 310 in a dual row configuration, although it is understood that the second posts 310 can have a different configuration. For example, the carrier system 300 can have the second posts 310 in a single row or triple row configuration. As a further example, the carrier system 300 can have the second posts 310 in a staggered configuration.

For further illustrative purposes, the carrier system 300 is shown with the first posts 308 and the second posts 310 having a square cross-sectional geometric shape, although it is understood that the first posts 308 and the second posts 310 can have a different cross-sectional geometric shape. For example the carrier system 300 can have the first posts 308 and the second posts 310 having a circular or rectangular cross-sectional geometric shape.

Figure 4:
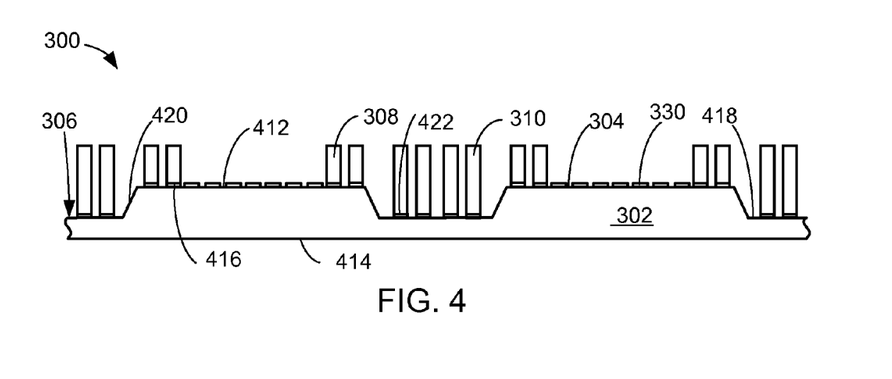
FIG. 4 is a cross-sectional view of the carrier system along line 4-4 of FIG. 3.

Referring now to FIG. 4, therein is shown a cross-sectional view of the carrier system 300 along line 4-4 of FIG. 3. The carrier base 302 can have a carrier first side 412 and a carrier second side 414. The planar surface 304 and the recess 306 can be along the carrier first side 412.

The recess 306 can have a recess bottom 418 and a recess slope 420. As an example, the recess slope 420 can form an obtuse angle or a right angle with the recess bottom 418. The recess bottom 418 can be parallel with the planar surface 304.

A first barrier 416 can be on the carrier first side 412 along the planar surface 304. As an example, the first barrier 416 can function as an etching protection layer, an adhesion layer, a buffer diffusion barrier layer, a wet-enhancing layer, or a combination thereof.

A second barrier 422 can be on the carrier first side 412 along the recess bottom 418. As an example, the second barrier 422 can function as an etching protection layer, an adhesion layer, a buffer diffusion barrier layer, a wet-enhancing layer, or a combination thereof.

The first posts 308 can be attached to the carrier first side 412 along the planar surface 304 with the first barrier 416. The first posts 308 can be perpendicular to the carrier first side 412. The portion of the first posts 308 facing away from the planar surface 304 can be parallel with the planar surface 304.

The contact pads 330 can be along the carrier first side 412. The contact pads 330 can extend from the planar surface 304. The contact pads 330 can be made from a material similar to the material used to form the first barrier 416.

The second posts 310 can be attached to the carrier first side 412 along the recess bottom 418 with the second barrier 422. The second posts 310 can be perpendicular to the carrier first side 412. The portion of the second posts 310 facing away from the recess bottom 418 can be parallel with the recess bottom 418. The portion of the second posts 310 facing away from the carrier first side 412 can be co-planar with the portion of the first posts 308 facing away from the carrier first side 412.

Figure 5:
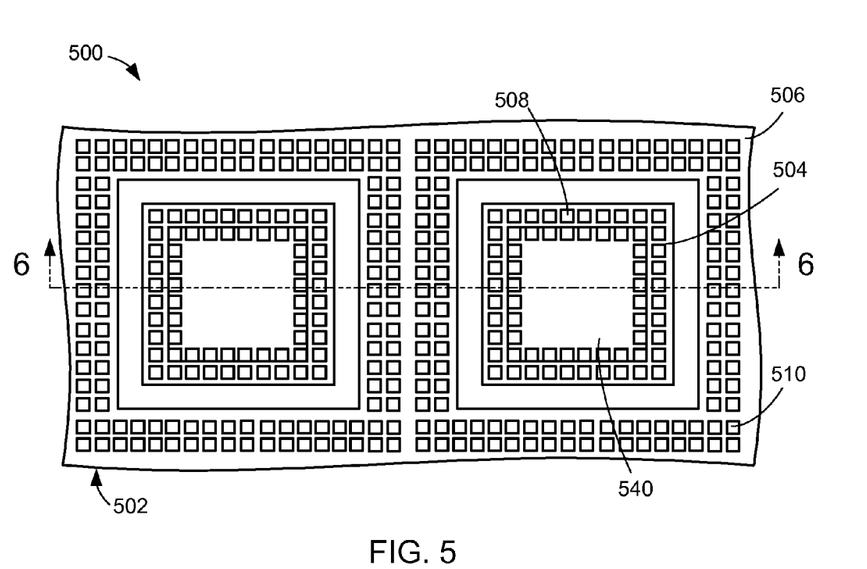
FIG. 5 is a top view of a portion of a carrier system in a third embodiment of the present invention.

Referring now to FIG. 5, therein is shown a top view of a portion of a carrier system 500 in a third embodiment of the present invention. The top view depicts a portion of a carrier base 502, such as a structure made of copper, other metals, alloys or conductive materials. The carrier base 502 can have a planar surface 504 and a recess 506. The recess 506 can be around the perimeter of the planar surface 504 where the recess 506, in this example is in a configuration of a square ring.

For illustrative purposes, the carrier system 500 is shown having the planar surface 504 in a square geometric shape, although it is understood that the planar surface 504 can have a different shape. For example, the planar surface 504 can have a rectangular geometric shape.

First posts 508, or more specifically a conductive structure or pillar made from copper or a conductive alloy, can be connected to the carrier base 502. The first posts 508 can be over the carrier base 502 along the planar surface 504. The first posts 508 can be along the peripheral portion of the planar surface 504.

For illustrative purposes, the carrier system 500 is shown having the first posts 508 in a dual row configuration, although it is understood that the first posts 508 can have a different configuration. For example, the carrier system 500 can have the first posts 508 in a single row or triple row configuration. As a further example, the carrier system 500 can have the first posts 508 in a staggered configuration.

A conductive structure 540, such as a conductive sheet or coating, can be along the planar surface 504 of the carrier base 502. The conductive structure 540 can be along an inner portion of the planar surface 504, as depicted by the solid square. The first posts 508 can surround the conductive structure 540. The first posts 508 can be on the conductive structure 540 and not covering the entire conductive structure 540.

Second posts 510, or more specifically a conductive interconnect or pillar made from copper or a conductive alloy, can be connected to the carrier base 502. The second posts 510 can be over the carrier base 502 in the recess 506.

For illustrative purposes, the carrier system 500 is shown having the second posts 510 in a dual row configuration, although it is understood that the second posts 510 can have a different configuration. For example, the carrier system 500 can have the second posts 510 in a single row or triple row configuration. As a further example, the carrier system 500 can have the second posts 510 in a staggered configuration.

For further illustrative purposes, the carrier system 500 is shown with the first posts 508 and the second posts 510 having a square cross-sectional geometric shape, although it is understood that the first posts 508 and the second posts 510 can have a different cross-sectional geometric shape. For example the carrier system 500 can have the first posts 508 and the second posts 510 having a circular or rectangular cross-sectional geometric shape.

Figure 6:
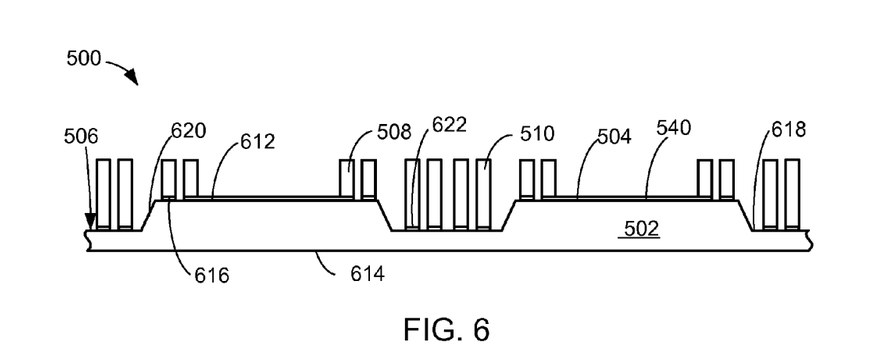
FIG. 6 is a cross-sectional view of the carrier system along line 6-6 of FIG. 5.

Referring now to FIG. 6, therein is shown a cross-sectional view of the carrier system 500 along line 6-6 of FIG. 5. The carrier base 502 can have a carrier first side 612 and a carrier second side 614. The planar surface 504 and the recess 506 can be along the carrier first side 612.

The recess 506 can have a recess bottom 618 and a recess slope 620. As an example, the recess slope 620 can form an obtuse angle or a right angle with the recess bottom 618. The recess bottom 618 can be parallel with the planar surface 504.

A first barrier 616 can be on the carrier first side 612 along the planar surface 504. As an example, the first barrier 616 can function as an etching protection layer, an adhesion layer, a buffer diffusion barrier layer, a wet-enhancing layer, or a combination thereof.

A second barrier 622 can be on the carrier first side 612 along the recess bottom 618. As an example, the second barrier 622 can function as an etching protection layer, an adhesion layer, a buffer diffusion barrier layer, a wet-enhancing layer, or a combination thereof.

The first posts 508 can be attached to the carrier first side 612 along the planar surface 504 with the first barrier 616. The first posts 508 can be perpendicular to the carrier first side 612. The portion of the first posts 508 facing away from the planar surface 504 can be parallel with the planar surface 504.

The conductive structure 540 can be along the carrier first side 612. The conductive structure can be conformal to the planar surface 504. The inner row of the first posts 508 can be connected along the outer portion of the conductive structure 540. The conductive structure 540 can be made from a material similar to the material used to form the first barrier 616.

The second posts 510 can be attached to the carrier first side 612 along the recess bottom 618 with the second barrier 622. The second posts 510 can be perpendicular to the carrier first side 612. The portion of the second posts 510 facing away from the recess bottom 618 can be parallel with the recess bottom 618. The portion of the second posts 510 facing away from the carrier first side 612 can be co-planar with the portion of the first posts 508 facing away from the carrier first side 612.

Figure 7:
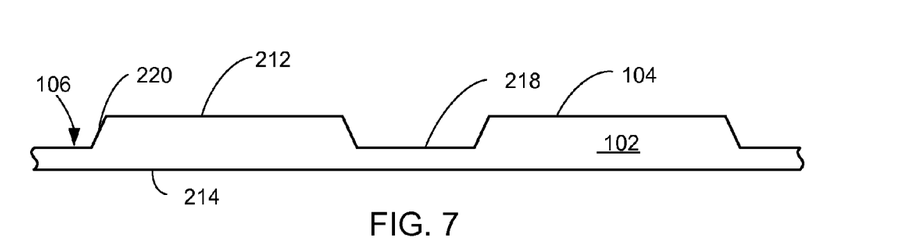
FIG. 7 is a cross-sectional view of a portion of the carrier base in a manufacturing phase of the carrier system of FIG. 1.

Referring now to FIG. 7, therein is shown a cross-sectional view of a portion of the carrier base 102 in a manufacturing phase of the carrier system 100 of FIG. 1. The carrier base 102, such as a structure made of copper, other metals, alloys or conductive materials, can have the carrier first side 212 and the carrier second side 214. The planar surface 104 and the recess 106 can be formed along the carrier first side 212. The recess 106 can be formed in the carrier base 102 with the recess 106 around the planar surface 104.

The recess 106 can be formed to include the recess bottom 218 and the recess slope 220. The recess 106 can be formed with the recess slope 220 at an obtuse or right angle with recess bottom 218. The recess bottom 218 can be formed to be parallel with the planar surface 104.

The planar surface 104 and the recess 106 can be formed by a number of different methods. For example, the planar surface 104 and the recess 106 can be formed by a physical process such as mechanical pressing of the carrier base 102 or by a chemical process such as etching.

Figure 8:
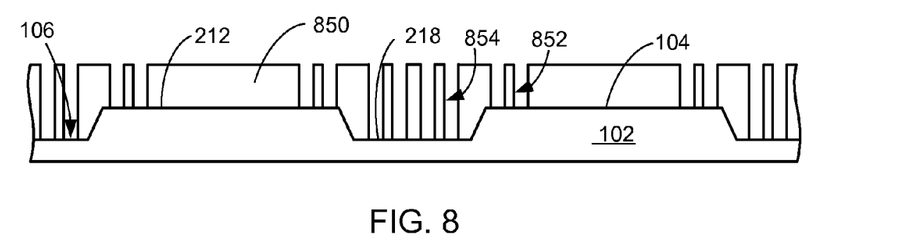
FIG. 8 is the structure of FIG. 7 in a masking phase of the carrier base.

Referring now to FIG. 8, therein is shown the structure of FIG. 7 in a masking phase of the carrier base 102. A mask 850, such as a patterned or developed photo-resist coating, can be formed over the carrier first side 212. A first channel 852 can be formed in the mask 850 over the planar surface 104. The first channel 852 can expose a portion of the carrier first side 212 along an outer portion of the planar surface 104.

A second channel 854 can be formed in the mask 850 over the recess 106. The second channel 854 can expose a portion of the carrier first side 212 in the recess 106.

The first channel 852 and the second channel 854 can be formed in a number of different ways. For example, the first channel 852 and the second channel 854 can be formed by photo-lithography or photo etching of the mask 850.

Figure 9:
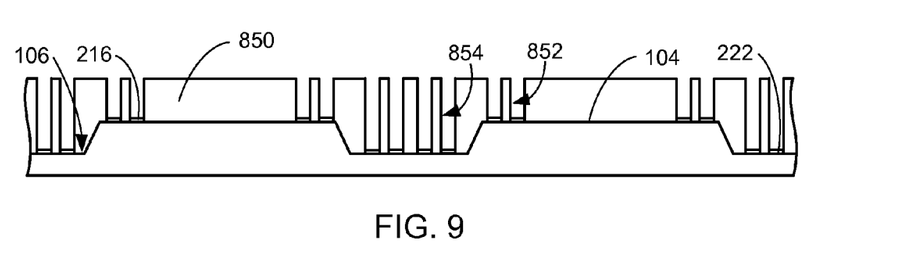
FIG. 9 is the structure of FIG. 8 in a forming phase of the first barrier and the second barrier.

Referring now to FIG. 9, therein is shown the structure of FIG. 8 in a forming phase of the first barrier 216 and the second barrier 222. The first barrier 216 can be formed in the first channel 852 and on the planar surface 104. As an example, the first barrier 216 can function as an etching protection layer, an adhesion layer, a buffer diffusion barrier layer, a wet-enhancing layer, or a combination thereof. Similarly, the contact pads 330 of FIG. 3 and the conductive structure 540 of FIG. 5 can be formed over the planar surface 104.

The second barrier 222 can be formed in the second channel 854 and formed on the carrier base 102 on the recess bottom 218. The second barrier 222 can function as an etching protection layer, an adhesion layer, a buffer diffusion barrier layer, a wet-enhancing layer, or a combination thereof.

The first barrier 216 and the second barrier 222 can be formed in a number of different ways. For example, the first barrier 216 and the second barrier 222 can be formed by methods such as chemical vapor deposition or physical vapor deposition. As a further example, the first barrier 216 and the second barrier 222 can be formed from a number of different conductive materials including aluminum, nickel/silver, or silver/gold alloys.

Figure 10:
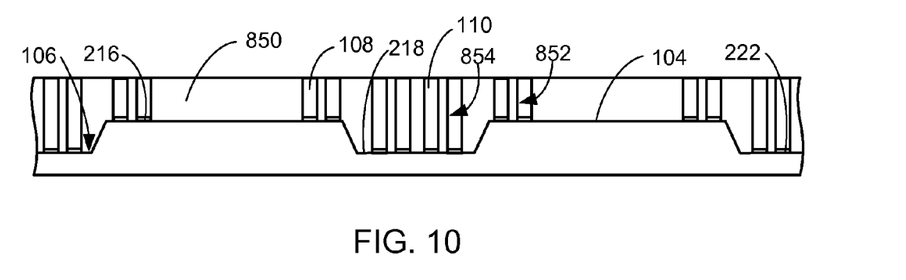
FIG. 10 is the structure of FIG. 9 in a forming phase of the first posts and the second posts.

Referring now to FIG. 10, therein is shown the structure of FIG. 9 in a forming phase of the first posts 108 and the second posts 110. The first posts 108 can be formed in the first channel 852. The first posts 108 can be formed over the planar surface 104 and on the first barrier 216. A side of the first posts 108 facing away from the planar surface 104 can be exposed from the mask 850. Similarly, the first posts 108 can be formed adjacent to and around the contact pads 330 of FIG. 3 or on the conductive structure 540 of FIG. 5 and not covering the entire conductive structure 540.

The second posts 110 can be formed in the second channel 854. The second posts 110 can be formed over the carrier first side 212 and on the second barrier 222. A side of the second posts 110 facing away from the carrier first side 212 can be exposed from the mask 850.

The first posts 108 and the second posts 110 can be formed in a number of different ways. For example, the first posts 108 and the second posts 110 can be formed from a chemical process, such as electro plating. The first posts 108 and the second posts 110 can be formed from materials different from the materials used to form the first barrier 216 and the second barrier 222. For example, the first posts 108 and the second posts 110 can be formed from copper or a conductive alloy.

The portion of the first posts 108 and the portion of the second posts 110 facing away from the carrier first side 212 and exposed from the mask 850 can be formed to be co-planar with the portion of the mask facing away from the carrier first side 212.

The first posts 108, the second posts 110, and the mask 850 can be planarized in a number of different ways. For example, the first posts 108, the second posts 110 and the mask 850 can be planarized by mechanical processes such as grinding or polishing.

Figure 11:
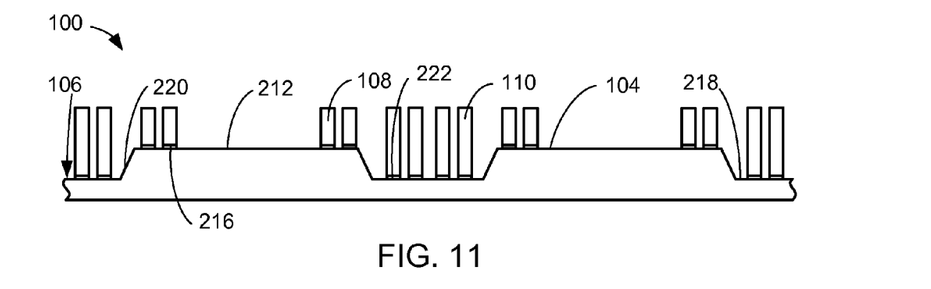
FIG. 11 is the structure of FIG. 10 in a removing phase of the mask of FIG. 10.

Referring now to FIG. 11, therein is shown the structure of FIG. 10 in a removing phase of the mask 850 of FIG. 10. The structure of FIG. 11 is shown with the mask 850 of FIG. 10 removed. The mask 850 can be removed by a number of different methods. For example, the mask 850 can be removed by methods such as resist stripping or oxidizing.

The removal of the mask 850 can form the carrier system 100. Removal of the mask 850 exposes the carrier base first side 212, the recess 106, the recess bottom 218, the recess slope 220, the planar surface 104, the first barrier 216, the second barrier 222, the first posts 108, and the second posts 110. The carrier system 100 can be used to form an integrated circuit packaging system.

Figure 12:
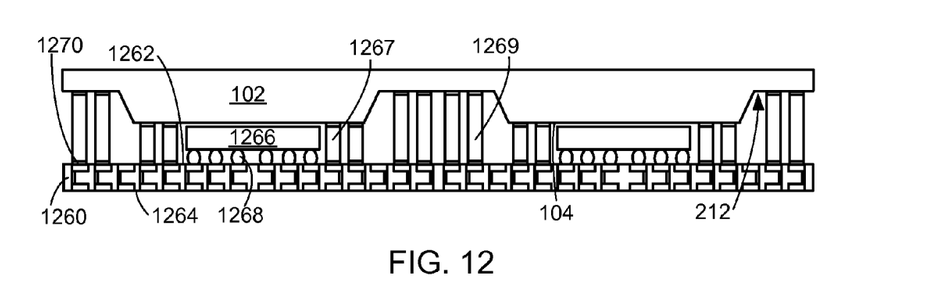
FIG. 12 is the structure of FIG. 11 in a mounting phase of the carrier base to a substrate.

Referring now to FIG. 12, therein is shown the structure of FIG. 11 in a mounting phase of the carrier base 102 to a substrate 1260. The substrate 1260, such as a laminated substrate, a ceramic substrate, or a chip carrier, can have a substrate first side 1262 and a substrate second side 1264. An integrated circuit 1266, such as a flip chip or an integrated circuit die, can be mounted over the substrate first side 1262. The integrated circuit 1266 can be connected to the substrate first side 1262 with internal interconnects 1268, such as solder balls, solder bumps or conductive bumps.

The carrier base 102 can be mounted over the substrate 1260 and the integrated circuit 1266. The carrier base 102 can be vertically inverted from the orientation shown in FIG. 11 with the carrier first side 212 facing the substrate first side 1262 and the planar surface 104 over the integrated circuit 1266. As an example, the planar surface 104 is shown not contacting the integrated circuit 1266.

The first posts 108 of FIG. 1 and the second posts 110 of FIG. 1 can be attached to the substrate first side 1262 to form first interconnects 1267 and second interconnects 1269, respectively. The carrier base 102 can be mounted over the substrate first side 1262 with the first interconnects 1267 adjacent to the integrated circuit 1266.

The first interconnects 1267 and the second interconnects 1269 can be connected to the substrate first side 1262 with interface interconnects 1270, such as a solder pad or a conductive pad. The interface interconnects 1270 can be formed in a number of different ways. For example, the side of the first interconnects 1267 and the side of the second interconnects 1269 facing away from a carrier first side 212 can be coated with a conductive material, such as solder, a metal, or a conductive alloy, by a process including hot or wave pot dipping prior to attachment to the substrate first side 1262. As a further example, conductive material can be coated on the substrate first side 1262 by a process including screen printing or solder dripping prior to attachment of the first interconnects 1267 and the second interconnects 1269. As a final example, the interface interconnects 1370 can be formed by a combination of the previously described methods.

Figure 13:
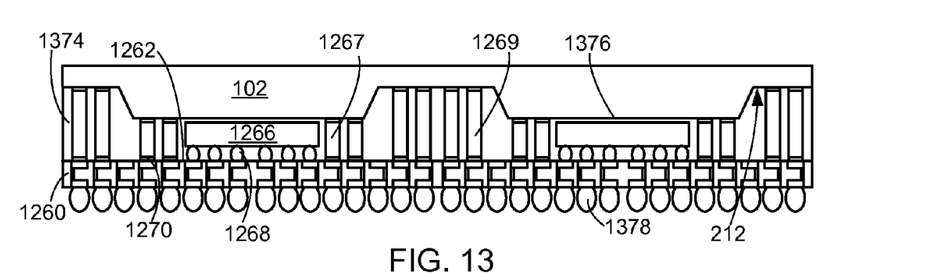
FIG. 13 is the structure of FIG. 12 in a molding phase of the carrier base with the substrate.

Referring now to FIG. 13, therein is shown the structure of FIG. 12 in a molding phase of the carrier base 102 with the substrate 1260. An encapsulation 1374, such as an epoxy molding compound or a wire in film, can be formed between the carrier base 102 and the substrate 1260. The encapsulation 1374 can be over the substrate first side 1262 and can cover the integrated circuit 1266, the internal interconnects 1268, the first interconnects 1267, the second interconnects 1269, and the interface interconnects 1270.

The encapsulation 1374 can have a cavity 1376 under the planar surface 104 and over the integrated circuit 1266. External interconnects 1378, such as solder balls or conductive bumps, can be attached to the substrate second side 1264.

Figure 14:
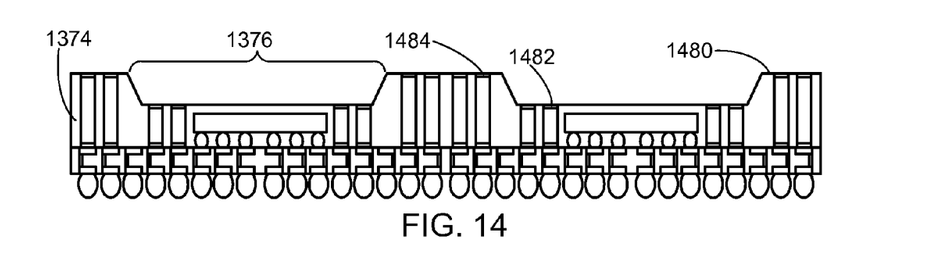
FIG. 14 is the structure of FIG. 13 in a removing phase of the carrier base of FIG. 1.

Referring now to FIG. 14, therein is shown the structure of FIG. 13 in a removing phase of the carrier base 102 of FIG. 1. The carrier base 102 can be removed to expose the encapsulation 1374. Removal of the planar surface 104 of FIG. 1 can expose the cavity 1376. Removal of the recess 106 of FIG. 1 can expose an encapsulation plateau 1480.

Removal of the carrier base 102 can remove a portion of the first barrier 216 of FIG. 2 and the second barrier 222 of FIG. 2. The removal of the carrier base 102 can form first mounting pads 1482 from the first barrier 216 and second mounting pads 1484 from the second barrier 222.

The first mounting pads 1482 and second mounting pads 1484 can have the characteristics of the carrier base 102 removed. The characteristics of the carrier base 102 removed can include physical features, such as an etched surface, chemical residue, or a chemically processed surface. The first mounting pads 1482 and the second mounting pads 1484 can protect the first interconnects 1267 and the second interconnects 1269, respectively, from removal by the method used to remove the carrier base 102.

The carrier base 102 can be removed by a number of different methods. For example, the carrier base 102 can be removed by chemical etching or stripping.

Figure 15:
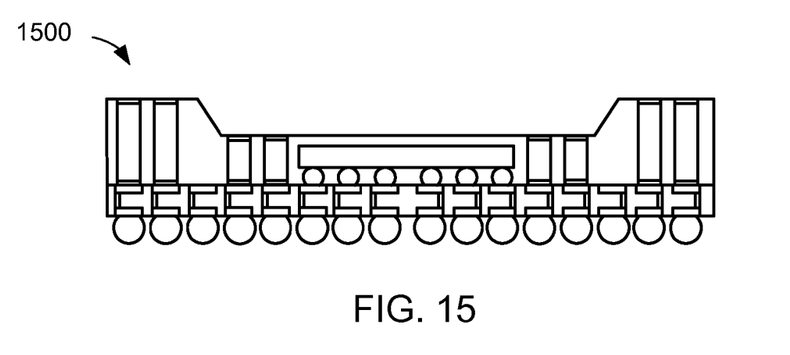
FIG. 15 is the structure of FIG. 14 in forming an integrated circuit packaging system.

Referring now to FIG. 15, therein is shown the structure of FIG. 14 in forming an integrated circuit packaging system 1500. The structure of FIG. 15 can be singulated to form the integrated circuit packaging system 1500.

The structure of FIG. 14 can be singulated by a number of different methods. For example, the structure of FIG. 14 can be singulated sawing or laser cutting.

Figure 16:
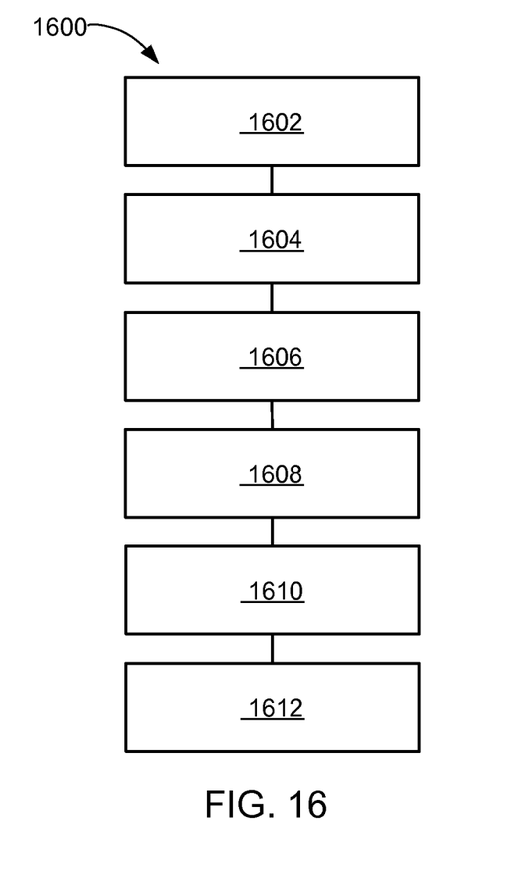
FIG. 16 is a flow chart of a method of manufacture of the carrier system in a further embodiment of the present invention.

Referring now to FIG. 16, therein is shown a flow chart of a method 1600 of manufacture of the carrier system 100 in a further embodiment of the present invention. The method 1600 includes providing a carrier base in a block 1602; forming a recess in the carrier base with the recess around the planar surface in a block 1604; forming a first barrier on the planar surface in a block 1606; forming a second barrier on the carrier base in the recess in a block 1608; forming a first post on the first barrier in a block 1610; and forming a second post on the second barrier in a block 1612.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of a carrier system comprising:
   providing a carrier base, the carrier base formed from a metallic material;
   forming a recess in the carrier base with the recess around a planar surface;
   forming a first barrier on and protruding from the planar surface;
   forming a second barrier on the carrier base in the recess;
   forming a first post on the first barrier; and
   forming a second post on the second barrier.

2. The method as claimed in claim 1 further comprising:
   forming a contact pad on the planar surface; and
   wherein:
   forming the first post includes forming the first post adjacent to the contact pad.

3. The method as claimed in claim 1 further comprising:
   forming a conductive structure on the planar surface; and
   wherein:
   forming the first post includes forming the first post on the conductive structure and not covering the entire surface of the conductive structure.

4. The method as claimed in claim 1 wherein forming the first post includes forming the first post perpendicular to the carrier base.

5. The method as claimed in claim 1 wherein forming the second post includes forming the second post perpendicular to the carrier base.

6. A method of manufacture of a carrier system comprising:
   providing a carrier base, the carrier base formed from a metallic material;
   forming a recess, having a recess bottom and a recess slope, in the carrier base with the recess around a planar surface;
   forming a first barrier on and protruding from the planar surface;
   forming a second barrier on the carrier base at the recess bottom;
   forming a first post on the first barrier; and
   forming a second post on the second barrier.

7. The method as claimed in claim 6 wherein forming the second post includes forming the second post co-planar with the first post.

8. The method as claimed in claim 6 wherein forming the recess includes forming the recess bottom parallel to the planar surface.

9. The method as claimed in claim 6 wherein forming the recess includes forming the recess having the recess slope at an obtuse angle with the recess bottom.

10. The method as claimed in claim 6 wherein forming the first barrier includes forming an etch protection layer.

11. A carrier system comprising:
    a carrier base having a recess around a planar surface, the carrier base formed from a metallic material;
    a first barrier on and protruding from the planar surface;
    a second barrier on the carrier base in the recess;
    a first post on the first barrier; and
    a second post on the second barrier.

12. The system as claimed in claim 11 further comprising:
    a contact pad on the planar surface; and
    wherein:
    the first post is adjacent to the contact pad.

13. The system as claimed in claim 11 further comprising:
    a conductive structure on the planar surface; and
    wherein:
    the first post is on the conductive structure and not covering the entire surface of the conductive structure.

14. The system as claimed in claim 11 wherein the first post is perpendicular to the carrier base.

15. The system as claimed in claim 11 wherein the second post is perpendicular to the carrier base.

16. The system as claimed in claim 11 wherein:
    the carrier having the recess includes a recess bottom and a recess slope; and
    the second barrier is on the carrier base at the recess bottom.

17. The system as claimed in claim 16 wherein the second post is co-planar with the first post.

18. The system as claimed in claim 16 wherein the carrier base having the recess bottom parallel with the planar surface.

19. The system as claimed in claim 16 wherein the carrier base having the recess slope at an obtuse angle with the recess bottom.

20. The system as claimed in claim 16 wherein the first barrier is an etch protection layer.

* * * * *